United States Patent
Gupta et al.

(10) Patent No.: US 7,627,849 B1
(45) Date of Patent: Dec. 1, 2009

(54) SYSTEM AND METHOD FOR VARYING THE STARTING CONDITIONS FOR A RESOLUTION ENHANCEMENT PROGRAM TO IMPROVE THE PROBABILITY THAT DESIGN GOALS WILL BE MET

(75) Inventors: Puneet Gupta, Santa Clara, CA (US); Andrew B. Kahng, Del Mar, CA (US)

(73) Assignee: Tela Innovations, Inc., Campbell, CA (US)

(*) Notice: Subject to any disclaimer, the term of this patent is extended or adjusted under 35 U.S.C. 154(b) by 253 days.

(21) Appl. No.: 11/386,268

(22) Filed: Mar. 21, 2006

Related U.S. Application Data

(60) Provisional application No. 60/664,112, filed on Mar. 21, 2005.

(51) Int. Cl.
G06F 17/50 (2006.01)
(52) U.S. Cl. .......................... 716/21; 716/20
(58) Field of Classification Search ............... 716/4–6, 716/21, 20
See application file for complete search history.

(56) References Cited

U.S. PATENT DOCUMENTS

| | | | |
|---|---|---|---|
| 6,854,096 B2 * | 2/2005 | Eaton et al. | 716/2 |
| 7,107,551 B1 * | 9/2006 | de Dood et al. | 716/2 |
| 2004/0237061 A1 | 11/2004 | Kahng et al. | |
| 2006/0095889 A1 * | 5/2006 | Cote et al. | 716/21 |

OTHER PUBLICATIONS

P. Gupta, A. B. Kahng, C. H. Park, Detailed Placement for Improved Depth of Focus and CD Control, Proc. Asia and South Pacific Design Automation Conf,. Jan. 2005, pp. 343-348.

Puneet Gupta, Andrew B. Kahng, Puneet Sharma, Dennis Sylvester, Selective Gate-Length Biasing for Cost-Effective Runtime Leakage Control, DAC 2004, Jun. 7-11, 2004, San Diego, California, USA.

* cited by examiner

*Primary Examiner*—Jack Chiang
*Assistant Examiner*—Binh C Tat
(74) *Attorney, Agent, or Firm*—Martine Penilla & Gencarella, LLP

(57) ABSTRACT

A method for improving a resolution enhanced (RE) layout produced by an RE program that starts with a nominal integrated circuit layout. For at least one feature of said layout at least one critical feature quality is chosen from a set of feature qualities and at least one starting condition of said resolution enhancement program is adjusted in response to said at least one critical feature quality.

13 Claims, 4 Drawing Sheets

SYSTEM AND METHOD FOR VARYING THE STARTING CONDITIONS FOR A RESOLUTION ENHANCEMENT PROGRAM TO IMPROVE THE PROBABILITY THAT DESIGN GOALS WILL BE MET

CROSS-REFERENCE TO RELATED APPLICATIONS

This application claims priority from provisional patent application 60/664,112, filed Mar. 21, 2005.

BACKGROUND

During the manufacture of modern integrated circuits, advanced photomasks are used to print integrated-circuit (IC) features with dimensions significantly less than the wavelength of light used in the optical lithography. Such advanced photomasks embody one or more resolution enhancement techniques (RETs), notably, optical proximity correction (OPC), sub-resolution assist features (SRAFs, also known as scattering bars (SBs)), and phase-shifting masks (PSM).

The layouts of these photomasks are designed automatically by an electronic design automation (EDA) computer program, which uses as an input a nominal chip layout originated by an earlier-executed set of EDA tools. The photomask layout-producing computer program may be referred to more specifically as a resolution enhancement (RE) program and not only produces an RE photomask design, but can also be commanded to produce an RE simulated layout that approximates the IC layout that the RE photomasks seek to produce. The RE simulated layout varies from the nominal layout according to differences that are unavoidable because of the inherent computational complexity of the RE photomask design problem. This unavoidable difference has been termed "error." It may be noted that the RE simulated layout not only has error with respect to the nominal layout but is also suboptimal in the sense that if infinite computer time was available an optimal RE simulated layout matching the nominal layout as closely as possible could be produced by the RE program. The differences between the RE simulated layout and the nominal layout include error and suboptimality, which are herein collectively termed as the "RE difference." There are also differences between the RE simulated layout and the eventual layout of the ICs manufactured by the masks designed by the RE program, due to inaccuracies in the RE program's modeling of the lithographic process, as well as to manufacturing errors.

Currently, the configuration and execution of the RE program is designed simply to arrive at an RE simulated layout that is as close as possible to the nominal layout, given the computer resources available. There appears to have been no suggestion of altering the starting conditions of the RE program to take advantage of opportunities to improve on the nominal layout, when possible, or to avoid differences with the nominal layout that would be particularly harmful. Such improvements and differences could affect the fabricated integrated circuit's performance, power, process window and/or manufacturing yield. In today's IC design and manufacturing process, the lack of RE program responsiveness to critical design aspects can cause severe problems.

The EDA tools used to originate the nominal layout use "guardbands" to ensure that the design will function correctly even if the worst expected error (e.g., a 6σ error) occurs for any particular feature in the realization of the nominal layout on the manufactured IC. The RE differences add to the error budget that determines the setting of the guardbands. The fact that the RE programs now run with no effort to bias the RE differences in a constructive manner forces EDA tools to guardband potential RE differences in a symmetric fashion. For example, if the RE program cannot guarantee that placement of a given feature's edges will be within a tolerance of less than five nanometers from that feature's edges in the nominal layout, then EDA tools will guardband the nominal layout dimension of the feature by at least +10 and −10 nanometers (since each of two opposite sides of the feature can be located by up to five nanometers from its nominal position).

The potentially harmful impact of symmetric guardbanding can be readily seen from the following examples. First, if a given transistor device has leakage power minimization as its most critical quality, then it would be advantageous that the result of the RE program be an edge location on the outer periphery of the tolerance band that is supplied as a starting condition to the RE algorithm. With current practices, however, the edge location could be anywhere in the symmetrically placed tolerance band, forcing the EDA tool to guardband so that the eventual IC will function even if the gate is as small as it would be if it just met the inner tolerance. The forced accommodation of this worst-case outcome creates inefficiencies in the nominal layout that are carried through to the finished IC. Moreover, the objective of building a gate that possesses the critical quality of leakage power minimization is likely to go unmet.

Second, there are also transistor devices that are setup-timing critical, i.e., the signal delay through the device cannot increase without jeopardizing the correctness of the IC's timing. For a setup-critical device, symmetric guardbanding forces the EDA tools to accommodate the worst-case signal delay that would result if the outer tolerance was just met. Again, this creates inefficiencies at every stage in the process that carries through to the final, manufactured IC. Also, the objective of building a gate that possesses the critical quality of signal delay minimization is likely to go unmet.

Third, feature density alters the effect of manufacturing process variability on feature qualities of an IC. In most lithographic processes, dense lines tend to print larger (i.e., with larger "critical dimension") with variation in focus, while isolated lines tend to print smaller. Isolated lines, therefore, are more likely to suffer "open" faults (i.e., breaks in the lines) if on metal layers, and more likely to suffer increased off-current (i.e., leakage) if on the poly layer, in the presence of defocus variation in the manufacturing process. On the other hand, dense lines are more likely to suffer "short" faults (i.e., the unwanted electrical bridging of two distinct lines) if on metal layers, and more likely to have increased off-current (i.e., leakage) and reduced on-current (i.e., drive strength) if on the poly layer, in the presence of defocus variation in the manufacturing process. These differing tendencies are not noted in current practice when running RE programs.

In present-day IC design-to-manufacturing flows, there is a lack of any asymmetric guidance to the RE program based on the need for a feature to meet a critical quality. This failing decreases the quality of today's RE simulated layouts, which results in loss of performance and parametric yield in manufactured ICs.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In a first separate aspect, the present invention may take the form of a method for improving a resolution-enhanced (RE) layout produced by an RE program that starts with a nominal integrated circuit layout. For at least one feature of said layout a most critical feature quality is chosen from a set of feature qualities and at least one starting condition of said resolution enhancement program is adjusted in response to said most critical feature quality.

In a second separate aspect, the present invention may take the form of an integrated circuit (IC) having features that vary in dimension and wherein the variation in feature dimension is related to critical feature qualities so that it enhances the probability that any particular circuit feature will possess a critical quality that increases the probability that the IC will function correctly.

In a third separate aspect, the present invention may take the form of a system adapted to accept a nominal integrated circuit layout as an input and to execute a program producing a resolution-enhanced layout based on said nominal layout and wherein said system is also adapted to accept as input a most-critical quality for each layout feature and to originate said resolution enhanced layout at least in part in response to said most-critical qualities of said layout features.

In addition to the exemplary aspects and embodiments described above, further aspects and embodiments will become apparent by reference to the drawings and by study of the following detailed descriptions.

BRIEF DESCRIPTION OF THE FIGURES

Exemplary embodiments are illustrated in referenced figures of the drawings. It is intended that the embodiments and figures disclosed herein are to be considered illustrative rather than restrictive.

DETAILED DESCRIPTION OF THE PREFERRED EMBODIMENTS

The present invention broadly provides a method for driving resolution enhancement (RE) computer programs such that differences between RE simulated layout and nominal layout (typically the product of an EDA program) are biased so as to improve design metrics such as power, performance, process window, and manufacturing yield. Those of ordinary skill in the art will realize that the following description of the present invention is illustrative only, and not in any way limiting. Other embodiments of the invention will readily suggest themselves to those skilled in the art.

One possible embodiment of the invention is comprised of the steps of:

obtaining a nominal layout of an IC, such as that generated from an EDA program;

obtaining an objective function from an engineer who is designing the IC, where the objective function provides a target for the IC design optimization and may include a critical threshold to be met for a parameter such as leakage power, timing robustness, or manufacturing yield, or a combination of parameters, either each with a critical threshold, which must be met, or in a weighted ranking;

for the subset of features, analyzing the features of the nominal layout in light of the objective function to determine a required RE difference bias for each feature and passing this required bias to a "difference bias implementer;"

transforming the required RE difference bias to altered starting conditions and/or inputs for an RE program; and using the RE program, originating an RE simulated layout, responsive to the altered starting conditions and/or input.

Those of ordinary skill in the art will readily see that variations of this embodiment suggest themselves according to objectives and constraints from IC design and product engineering.

Figure 1:
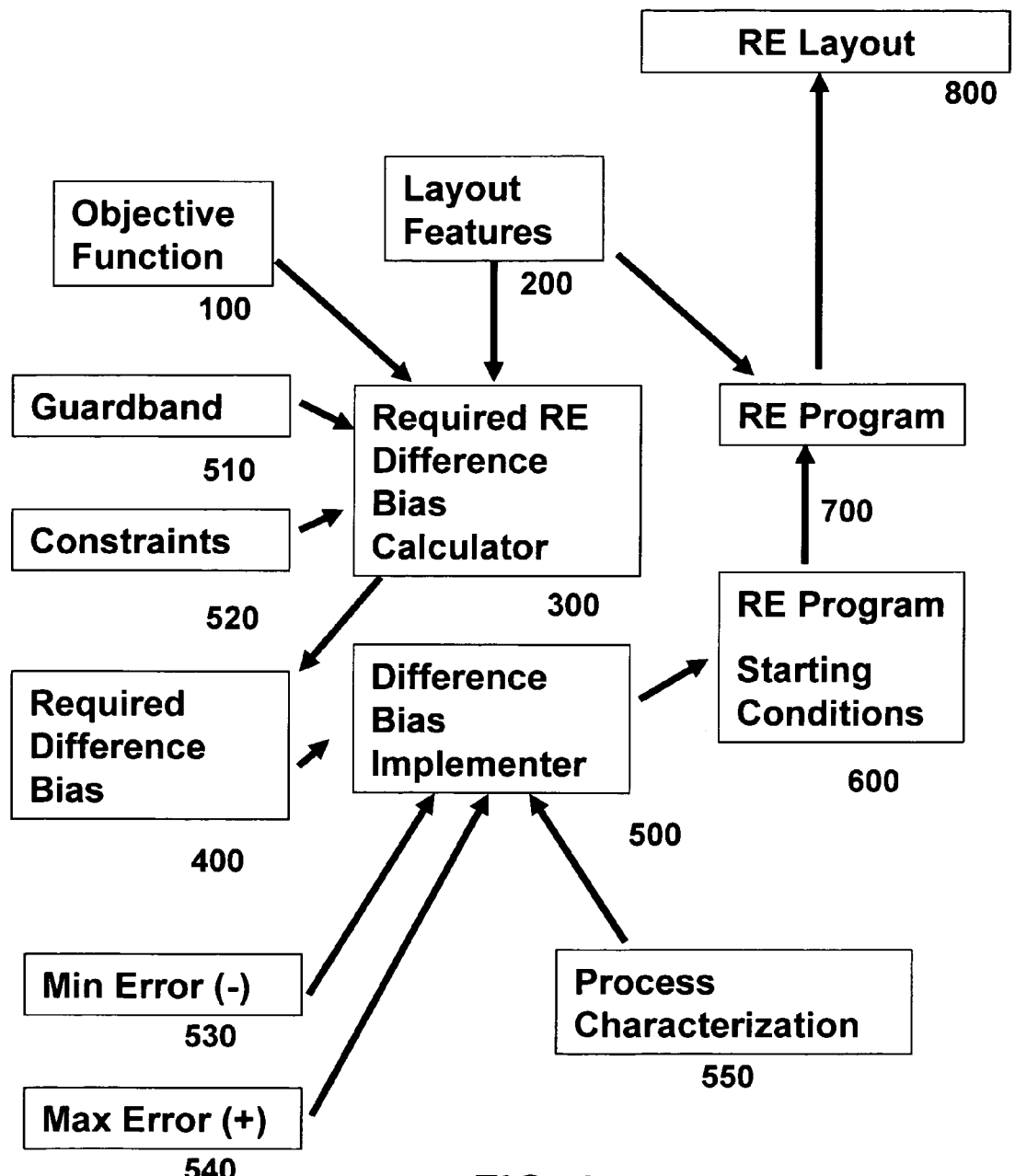
FIG. 1 is a flowchart that shows how asymmetric difference biases can be introduced into an IC design-to-manufacturing flow.

FIG. 1 is a flowchart that illustrates this example embodiment. First a nominal layout 200 is obtained from an EDA program. A subset of features, which may include all of the features, is identified in this layout. For each feature in the subset a most-critical quality is identified. The selection of the most-critical quality is performed by an EDA tool such as a static timing analyzer or circuit simulator. An additional program may be used to translate the results of the existing EDA tool into most critical quality assignments. For a transistor gate, qualities that could be identified as most critical are setup timing robustness, hold timing robustness, manufacturing yield, and leakage power. For a conductive line, qualities that could be identified as most critical are open-fault robustness, short-fault robustness, manufacturing yield, dynamic power, setup timing robustness, and hold timing robustness.

In one preferred embodiment an objective function of critical qualities is assigned to each feature. For example, if the most critical quality is very critical to IC yield and/or correct operation, a rank of ten (10) would be assigned, whereas if no quality was significantly more important than the others, a ranking of one (1) would be assigned. In another preferred embodiment the importance of the critical qualities could be indicated by weights either in addition to or in place of rankings. In another preferred embodiment, both an objective function of critical qualities and a set of critical quality constraints is assigned to each feature.

A required RE difference calculator determines a difference bias for every layout feature of the subset, based on the most-critical quality. Features of a nominal layout 200 are used by a preferred difference calculator 300 to determine a preferred difference bias 400 for every layout feature. Generally, this determination is based as necessary on fundamental device and circuit properties, SPICE modeling, etc. Specifically, in reference to FIG. 1, the following parameters are used:

(A) Guardband specifications 510: These are additional contributors to the difference between nominal and manufactured layout. These differences may arise from outside the RE program, through other manufacturing error sources including but not limited to mask write error, exposure dose variation, etc.

(B) Design constraints 520: These constraints are requirements imposed by the designer on the manufactured IC. For example, a required manufacturing yield or a required IC operating speed would be a design constraint. More generally, design constraints may pertain to any of a number of chip-level metrics, including but not limited to timing, dynamic power, static power, reliability, and manufacturing yield.

Figure 2:
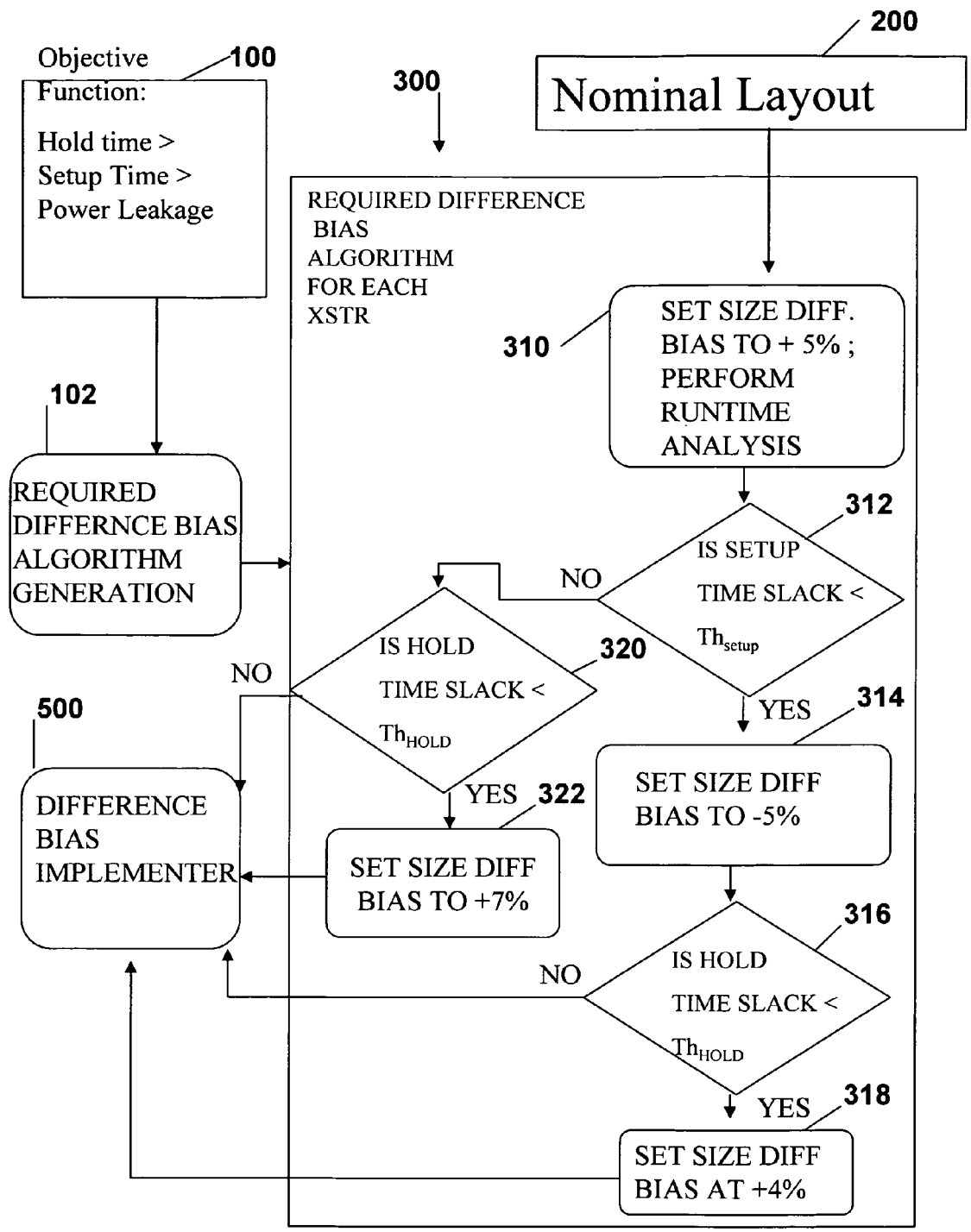
FIG. 2 is a flowchart that illustrates the operation of a required difference bias calculator according to a preferred embodiment of the present invention.

Referring to FIG. 2, the objective function 100 is used by the required difference bias algorithm generation process 102, which may be simply the setting of constants in the algorithm and fully automated or may require some human input. This gives rise to the required difference bias algorithm 300 which accepts the nominal layout 200 as input. Operation block 310 sets a starting difference bias of +5% in response to the lowest priority objective of minimizing leakage power. Next, there is a determination for each gate of whether the setup time slack is greater than the relevant threshold $Th_{SETUP}$ (decision box 312). If it is, the size difference bias requirement is reset to −5%. In either case, another test is performed to see if the hold time slack is less than the hold time threshold $Th_{HOLD}$ (Decision boxes 316 and 322). If this is the case, and setup time is not a problem, a difference bias of requirement of +7% is introduced (operation block 322). If this is the case, but setup time is a problem, then a more moderate +4% difference bias requirement is introduced (operation block 316). The difference bias is sent to the difference bias implementer 500.

The preferred difference bias 400 is then passed to a difference bias implementer 500 which transforms desired difference biases into alterations in starting conditions and/or data input 600 for an RE program 700. The difference bias implementer 500 also receives additional information, including but not limited to the types listed below.

Figure 3:
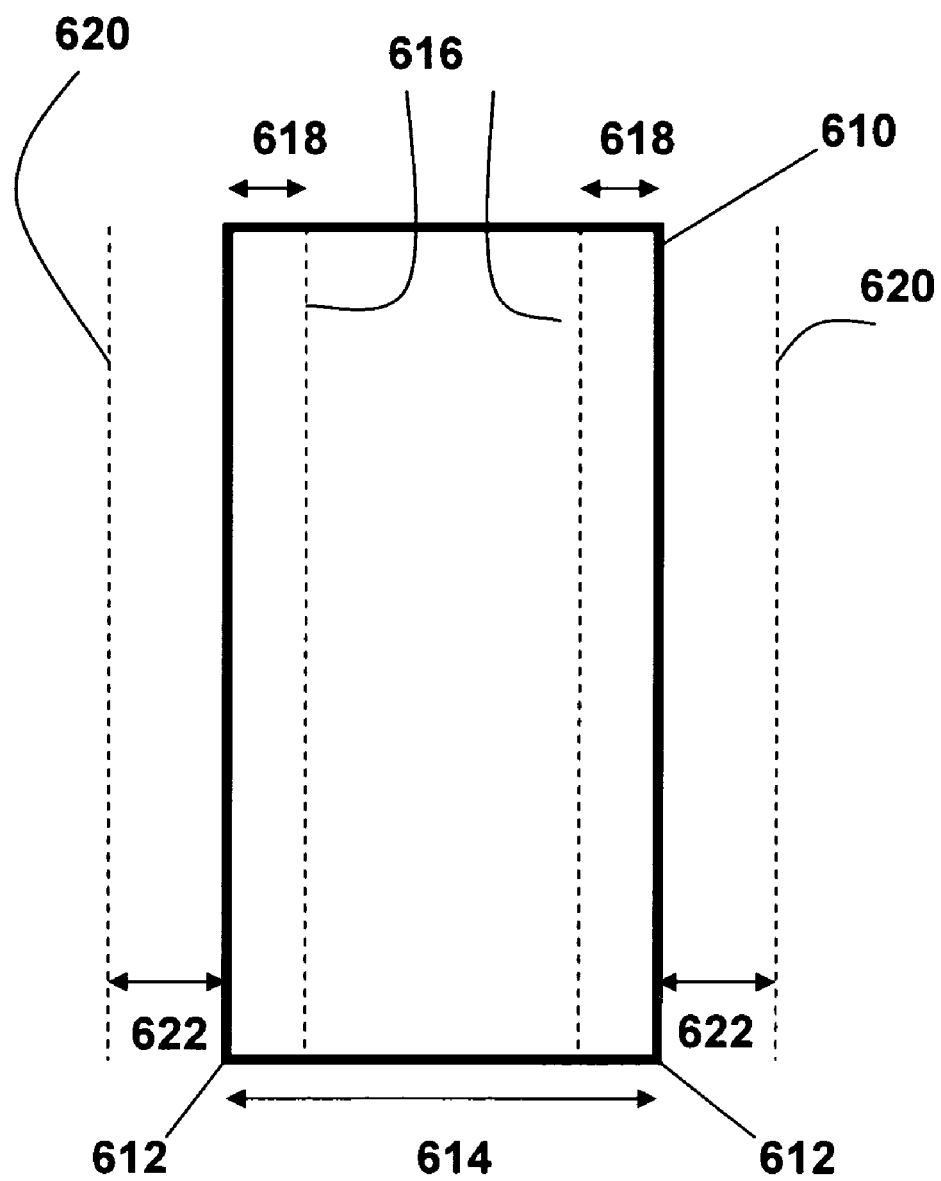
FIG. 3 illustrates the concepts of Inner Tolerance, Outer Tolerance, and Starting Side as starting conditions for a resolution enhancement program.

(A) Lower bounds 530 and upper bounds 540 on tolerable difference: Inner tolerance and outer tolerance (FIG. 3) must be selected to be within these bounds 530 and 540, which are often respectively identical for every instance of the same component type in the circuit. For example, all of the field effect transistors (FETs) could have the same tolerable difference bounds, set so as to prevent two FETs from shorting to each other in the manufactured IC, or to prevent a FET from being so small that it does not function correctly in the manufactured IC. The sources of lower bounds 530 and upper bounds 540 include but are not limited to product requirements (e.g., with respect to tightness of parametric yield of the IC product), EDA algorithm convergence and runtime (e.g., an algorithm may run too long or fail to converge if the error tolerance is too tight), and process and equipment tolerances.

(B) Process characterization 550: This translates the effect of starting condition and data changes into error probability in either the RE simulated layout or the finished IC. To find the process characterization to the RE simulated layout the RE program is executed for a number of differing test patterns and the effect of differing starting conditions is calculated. Knowledge of manufacturing process specifics is necessary to derive a process characterization from the RE simulated layout to the manufactured IC.

Referring to FIG. 2, one possible embodiment of this invention is in the context of setting the starting conditions of an RE program that iteratively optimizes feature edge locations. For example, the length of a transistor gate 610 can be changed to facilitate meeting the transistor's most critical quality by shifting its nominal edge locations 612. Accordingly a new gate length replaces the nominal gate length 614. The program continues to execute its optimization for a particular feature edge location, until the edge location is located within an inner tolerance band 618 or outer tolerance band 622. In an alternative preferred embodiment, the inner tolerance 618 band and/or the outer tolerance band 622 is different on a first side (for example, the left side in FIG. 3) of the feature than on the other side. In some instances one edge may have a higher likelihood of bridging to another component than the other edge. In one preferred embodiment, the specific components of required RE difference calculator 300 and difference bias implementer 500 are achieved as follows.

This "Tolerance Optimizer" example of a difference bias calculator 300 uses data from transistor gate and/or wire performance characterization steps to improve the IC design and manufacturing objectives of timing and/or power. The level of correction is adjusted dynamically depending on the criticality of timing or power for each gate (e.g., standard-cell) instance or signal net. The adjusted parameters for RE are associated with feature edge placement difference (EPD) as follows. In this embodiment, tolerance values are the same for both sides of a feature. In an alternative preferred embodiment, the tolerance values may be different on the different sides. In the following discussion, we use an inside edge 616 to refer to the innermost allowed location of a feature edge, i.e., at the inner extreme of the inner tolerance band 618. Similarly, an outside edge 620 refers to the outermost allowed location of a feature edge, at the outer extreme of the outer tolerance band 622. Note that here, "inner" and "outer" are with respect to the body of the feature.

The inner tolerance band 618 refers to the tolerance with respect to the inside edge of a feature. This is a non-positive number. Relaxing the IT band 618 (making it more negative) makes the effective gate length smaller ($L_{nom}+2IT$) which improves the yield for setup-time slacks at the expense of increase in the worst-case static (leakage) power.

The outer tolerance band 622 refers to the tolerance with respect to the outer edge of a feature. This is a non-negative number. Relaxing the OT (making it more positive) makes the effective gate length larger ($L_{nom}+2OT$) which improves the yield for hold slacks at the expense of increase in the worst-case dynamic (switching) power.

Starting side (SSIDE) is the starting side for the iterative OPC correction process. If this is set to inside 616 (outside 620), the effective feature size is likely to end up at a value close to that defined by the locations of the inside 616 (outside 620) edges of the inner or outer tolerance bands 618 or 622, respectively. If SSIDE is set to outside 620, the gate length is likely to become larger, resulting in improved IC manufacturing yield for static power and hold slacks. If SSIDE is set to inside 616, the gate length is likely to become smaller, resulting in improved manufacturing yield for dynamic power and setup slacks.

The following summarizes the effect of tolerance and SSIDE variables on timing, power and yield. We use the notations: (1) Tsetup=timing for setup (late paths); (2) Thold=timing for hold (early paths); (3) Psta=static (leakage) power; (4) Pdyn=dynamic (switching) power; (5) Yield (Tsetup)=parametric yield for setup timing; (6) Yield (Thold)=parametric yield for hold timing; (7) Yield(Psta)=parametric yield for static power; and (8) Yield (Pdyn)=parametric yield for dynamic power.

| Variable | Control Direction | Worst Case Tsetup Pdyn | Yield (Tsetup) Yield (Pdyn) | Worst Case Thold Psta | Yield (Thold) Yield (Psta) | Other impacts |
|---|---|---|---|---|---|---|
| IT | Relax ↓ | — | Better | Worse | Worse | Possible min transition time, min capacitance violation; Mask Cost ↓ |
|  | Tighten ↑ | — | Worse | Better | Better | Mask Cost ↑ |

-continued

| Variable | Control Direction | Worst Case Tsetup Pdyn | Yield (Tsetup) Yield (Pdyn) | Worst Case Thold Psta | Yield (Thold) Yield (Psta) | Other impacts |
|---|---|---|---|---|---|---|
| TO | Relax ↑ | Worse | Worse | Better | — | Possible max transition time, max capacitance violation; Mask Cost ↓ |
| SSIDE | Tighten ↓ | Better | Better | — | Worse | Mask Cost ↑ |
|  | Inside | — | Better | — | Worse | Mask Cost ? |
|  | Outside | — | Worse | — | Better | Mask Cost ? |

In one preferred embodiment, the difference bias implanter 500 implements an algorithm in the form:

For Negative Bias:
Start RE program on the inside and use the following Actual Inner Tolerance ($IT_A$)

$$IT_{AP} = IT_N + C_1 * RBias - C_2 \quad (A)$$

$$\text{if } IT_{AP} < IT_{AMIN} \text{ Then } IT_A = IT_{AMIN}; \quad (B)$$

$$\text{Else: } IT_A = IT_{AP} \quad (C)$$

where $IT_N$=Nominal Inner Tolerance; RBias=Required Bias; $C_1$ and $C_2$ are constants derived from the process characterization using standard fitting methods, such as linear regression. $C_2$ generally corresponds to the amount of bias introduced by starting the algorithm on the inside. $IT_{AP}$ is a preliminary adjusted inner tolerance; $IT_{AMIN}$ is the minimum inner tolerance based on the layout context of the feature as well as the lower bound 530, discussed above.

For Positive Bias
Start RE program on the outside and use the following $OT_A$ $$OT_A = OT_N + C_3 * RBias - C_4 \quad (A)$$

$$\text{if } OT_{AP} > OT_{AMAX} \text{ Then } IT_A = IT_{AMAX}; \quad (B)$$

$$\text{Else: } OT_A = OT_{AP} \quad (C)$$

where $OT_N$=Nominal Outer Tolerance; RBias=Required Bias; $C_3$ and $C_4$, similar to $C_1$ and $C_2$ are constants derived from the process characterization using standard fitting methods such as linear regression. $C_4$ generally corresponds to the amount of bias introduced by starting the algorithm on the outside $OT_{AP}$ is a preliminary adjusted inner tolerance; $OT_{AMAX}$ is the maximum outer tolerance based on the layout context of the feature as well as the upper bound 540, discussed above.

As an example, the design of a particular FET gate "gate 1" is followed through the system. The gate is sized uniformly to all the other FET gates by the EDA tools that originate the nominal layout which is sent to the RE program. By way of modeling, and in view of the objective function 200, it is determined that the most critical quality of this gate is setup timing ($Th_{setup}$). To achieve a faster setup time, a shorter gate length is desirable. In anticipation that the RE program would introduce a bias, this feature was guardbanded by the EDA tools as being sized anywhere from its nominal length to a length 10 nm shorter. Based on this, the required difference bias calculator 300 issues a required difference bias for each edge of −5 nm.

The difference bias implementer 500 calculates, based on RE process characterization information, that of the needed −5 nm per side, −2 nm may be obtained simply by starting the RE program on the inside of nominal gate 1 for each edge. It also determines that by relaxing the inner tolerance by 4 nm it can bias the difference by an additional −3 nm. The outer tolerance is tightened by 5 nm on either side to prevent a setup timing error that is outside of the guardband used by the EDA tools. Accordingly the difference bias implementer determines that −5 nm of bias can be implemented and the three changes required to achieve this result, the loosening of the inner bias, the tightening of the outer tolerance and beginning the RE program on the inside of the nominal gate are sent to the RE program as starting conditions with the respect to gate 1.

Figure 4:
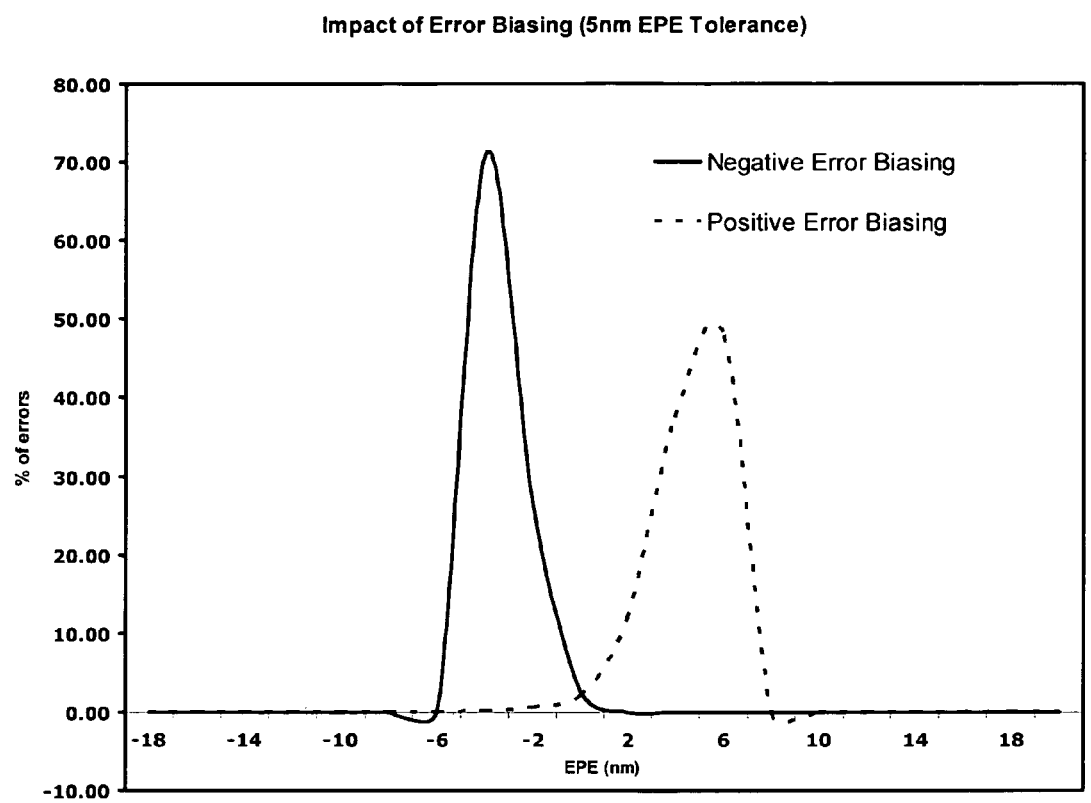
FIG. 4 illustrates the effect of applying the biased difference guidance to an Optical Proximity Correction program, which may form a part of a resolution enhancement program.

FIG. 4 shows the impact of difference biasing in the context of model-based Optical Proximity Correction, which is a part of an RE program. When the edge placement difference (EPD) is biased toward the left (i.e., a negative bias), the distribution of actual edge placement differences is strongly skewed to the left. Similarly, when the EPD is biased toward the right (i.e., a positive bias), the distribution is skewed to the right. This figure illustrates the potential to realize the designer's intent—i.e., whether a given feature should best err in its printed dimension toward the positive (for leakage power or hold time constraints) or toward the negative (for setup time constraints)—through application of the present invention.

After the RE simulated layout and mask design are finalized, the mask system may be produced and ICs may be produced. The finished product ICs will bear a recognizable trait of having feature size related to critical feature quality in a beneficial manner that increases the probability of correct functioning.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A method for improving a manufactured integrated circuit layout that is produced in part through application of an optical proximity correction (OPC) program, comprising:
   (A) providing a nominal integrated circuit layout; and
   (B) for at least one feature of said layout:
      i. choosing at least one critical feature quality from a set of feature qualities; and
      ii. adjusting at least one starting condition of said optical proximity correction program in response to said at least one critical feature quality, said adjusted starting condition being chosen from among a set of starting conditions consisting of the feature outer tolerance, the feature inner tolerance, or the feature starting side
   wherein for said at least one feature more than one critical qualities are selected and a constraint set of critical qualities is assigned to said at least one feature, and said step of choosing a critical feature quality is performed automatically by a computer program and informed by objectives and/or constraints for said manufactured IC layout.

2. The method of claim 1, wherein step (b) is performed for multiple features of said nominal layout.

3. The method of claim 2, wherein step (b) is performed for every feature of said nominal layout.

4. The method of claim 1, wherein said at least one critical feature quality is selected from a set of qualities that includes, but is not limited to, timing for setup (late paths); timing for hold (early paths); static (leakage) power; dynamic (switching) power; parametric yield for setup timing; parametric yield for hold timing; parametric yield for static power; and parametric yield for dynamic power.

5. The method of claim 1, further including the steps of executing said RE program and producing at least one photomask whose layout is indicated by results of said RE program.

6. The method of claim 5, further including the step of producing at least one integrated circuit from the said at least one photomask.

7. The method of claim 1, wherein said critical qualities are each assigned a relative importance.

8. The method of claim 1, wherein an objective function of critical qualities is assigned to said at least one feature.

9. The method of claim 1, wherein a constraint set of critical qualities is assigned to said at least one feature.

10. The method of claim 1 wherein said feature outer tolerance is set so that it is not symmetric with feature inner tolerance.

11. A system adapted to accept a nominal integrated circuit layout as an input and to execute a program producing a resolution enhanced layout based on said nominal layout and wherein said system is also adapted to accept as input at least one critical quality for at least one layout feature and to adjust at least one starting condition of said resolution enhancement program in response to said at least one critical feature quality, said adjusted starting condition being chosen from among a set of starting conditions consisting of the feature outer tolerance, the feature inner tolerance, or the feature starting side for an optical proximity correction algorithm wherein said system is adapted to accepted multiple critical qualities for each layout feature, a constraint set of critical qualities may be assigned to each said feature, and including a subsystem for automatically choosing said at least one critical quality based on manufactured IC layout design objectives and/or constraints.

12. The system of claim 11, wherein said multiple critical qualities are each assigned a relative importance.

13. The system of claim 11, wherein an objective function of critical qualities may be assigned to each of said features.

* * * * *